United States Patent
Okada et al.

(10) Patent No.: US 10,529,807 B2
(45) Date of Patent: Jan. 7, 2020

(54) STACKED BODY AND ELECTRONIC DEVICE

(71) Applicants: Sumitomo Electric Industries, Ltd., Osaka-shi (JP); TOHOKU UNIVERSITY, Sendai-shi (JP)

(72) Inventors: Masaya Okada, Itami (JP); Fuminori Mitsuhashi, Itami (JP); Masaki Ueno, Itami (JP); Yasunori Tateno, Yokohama (JP); Maki Suemitsu, Sendai (JP); Hirokazu Fukidome, Sendai (JP)

(73) Assignees: Sumitomo Electric Industries, Ltd., Osaka-shi (JP); Tohoku University, Sendai-shi (JP)

( * ) Notice: Subject to any disclaimer, the term of this patent is extended or adjusted under 35 U.S.C. 154(b) by 0 days.

(21) Appl. No.: 15/491,738

(22) Filed: Apr. 19, 2017

(65) Prior Publication Data
US 2017/0301759 A1    Oct. 19, 2017

(30) Foreign Application Priority Data

Apr. 19, 2016 (JP) ................................ 2016-083869
Dec. 1, 2016 (JP) ................................ 2016-234445

(51) Int. Cl.
     *H01L 29/16*      (2006.01)
     *H01L 21/02*      (2006.01)
     *H01L 29/66*      (2006.01)

(52) U.S. Cl.
CPC .... *H01L 29/1606* (2013.01); *H01L 21/02378* (2013.01); *H01L 21/02433* (2013.01); *H01L 21/02527* (2013.01); *H01L 29/66045* (2013.01)

(58) Field of Classification Search
CPC ........... H01L 29/1606; H01L 29/66015; H01L 21/02378; H01L 21/02433;
(Continued)

(56) References Cited

U.S. PATENT DOCUMENTS

2011/0048625 A1*   3/2011   Caldwell ................ B82Y 30/00
                                                                          156/233
2012/0112164 A1    5/2012   Chu et al.
(Continued)

FOREIGN PATENT DOCUMENTS

JP      2015-048258 A      3/2015

OTHER PUBLICATIONS

U.S. Appl. No. 15/454,327, filed Mar. 9, 2017.
(Continued)

*Primary Examiner* — Timor Karimy
(74) *Attorney, Agent, or Firm* — Baker Botts L.L.P.; Michael A. Sartori

(57) ABSTRACT

A stacked body includes: a substrate made of silicon carbide and having a first main surface forming an angle of 20° or less with a carbon plane; and a graphene film disposed on the first main surface and having an atomic arrangement oriented in relation to an atomic arrangement of silicon carbide forming the substrate. In an exposed surface of the graphene film as seen in plan view, 10 or less regions are present per 1 mm², the exposed surface being a main surface opposite to the substrate, and the regions each including 10 or more graphene layers and having a circumcircle with a diameter of 5 μm or more and 100 μm or less. Accordingly, the stacked body is provided that enables a high mobility to be stably ensured in an electronic device manufactured to include the graphene film forming an electrically conductive portion.

5 Claims, 8 Drawing Sheets

(58) Field of Classification Search
CPC ......... H01L 29/41775; H01L 29/66045; H01L 29/7781; H01L 29/78684; H01L 21/02527; H01L 21/02612; H01L 21/043; H01L 21/6719
See application file for complete search history.

(56) References Cited

U.S. PATENT DOCUMENTS

| | | | |
|---|---|---|---|
| 2013/0214253 A1 | 8/2013 | Hiura et al. | |
| 2013/0272951 A1* | 10/2013 | Hiura | H01L 21/0237 423/448 |
| 2015/0338322 A1 | 11/2015 | Damiano, Jr. et al. | |
| 2016/0137507 A1 | 5/2016 | You et al. | |

OTHER PUBLICATIONS

U.S. Appl. No. 15/491,690, filed Apr. 19, 2017.
Office Action issued in U.S. Appl. No. 15/491,690, dated May 15, 2018.
Notice of Allowance issued in U.S. Appl. No. 15/454,327, dated Apr. 27, 2018.
Office Action issued in U.S. Appl. No. 15/454,327, dated Dec. 29, 2017.
Office Action issued in U.S. Appl. No. 15/491,690, dated Nov. 24, 2017.
Notice of Allowance dated Jan. 30, 2019 issued in the related U.S. Appl. No. 15/491,690.
Office Action for U.S. Application No. 15/491,690 dated Jun. 21, 2019.
Feenstra, R.M., "Structural studies of epitaxial graphene formed on SiC{001} surfaces," Doctoral Thesis, Department of Physics, Carnegie Mellon University, Pittsburgh, PA, 2010.
Notice of Allowance in U.S. Application No. 15/491,690, dated Oct. 23, 2019.

* cited by examiner

STACKED BODY AND ELECTRONIC DEVICE

BACKGROUND OF THE INVENTION

Field of the Invention

The present invention relates to a stacked body and an electronic device. The present application claims priority to Japanese Patent Application No. 2016-083869 filed on Apr. 19, 2016 and Japanese Patent Application No. 2016-234445 filed on Dec. 1, 2016, and the entire contents of which are hereby incorporated by reference.

Description of the Background Art

Graphene is a material in which carbon atoms form an $sp^2$ hybrid orbital and the carbon atoms are bonded two-dimensionally. Graphene in which carbon atoms are bonded in such a condition has a feature that the carrier mobility is remarkably high. Therefore, by use of a graphene film as a channel of an electronic device such as transistor, for example, the electronic device is expected to be increased in switching speed.

An electronic device in which a graphene film is used as an electrically conductive portion (channel for example) can be manufactured by forming a stacked body including the graphene film and forming electrodes or the like on the stacked body. The stacked body including the graphene film can be formed for example by bonding to a support substrate a graphene thin film exfoliated from graphite, or bonding to a support substrate a graphene thin film grown by CVD (Chemical Vapor Deposition).

In order to ensure an acceptable production efficiency in mass production of electronic devices, it is preferable to use a support substrate having a large diameter (having a diameter of two inches or more, for example) in the stacked body. In the stacked body formed through a procedure including bonding of a graphene film as described above, a large region without the graphene film is included in the surface of the support substrate. In such a case, a process for manufacturing an electronic device, such as positional alignment for forming electrodes, is difficult to automate. A resultant problem is that mass production of electronic devices in which the aforementioned stacked body is used is difficult to automate.

In contrast, a method has been proposed according to which a substrate made of SiC (silicon carbide) is heated to desorb Si atoms and thereby transform a surface layer of the substrate into graphene, and accordingly a stacked body in which the graphene film is formed on the substrate is produced (see Japanese Patent Laying-Open No. 2015-48258 for example). Thus, in the main surface of the substrate, the region without the graphene film is reduced. As a result of this, mass production of electronic devices in which the stacked body is used is facilitated.

SUMMARY OF THE INVENTION

A stacked body of the present disclosure includes: a substrate made of silicon carbide and having a first main surface forming an angle of 20° or less with a carbon plane; and a graphene film disposed on the first main surface and having an atomic arrangement oriented in relation to an atomic arrangement of silicon carbide forming the substrate. In an exposed surface of the graphene film as seen in plan view, 10 or less regions are present per 1 mm$^2$. The exposed surface is a main surface opposite to the substrate, and the regions each include 10 or more graphene layers and have a circumcircle with a diameter of 5 μm or more and 100 μm or less.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
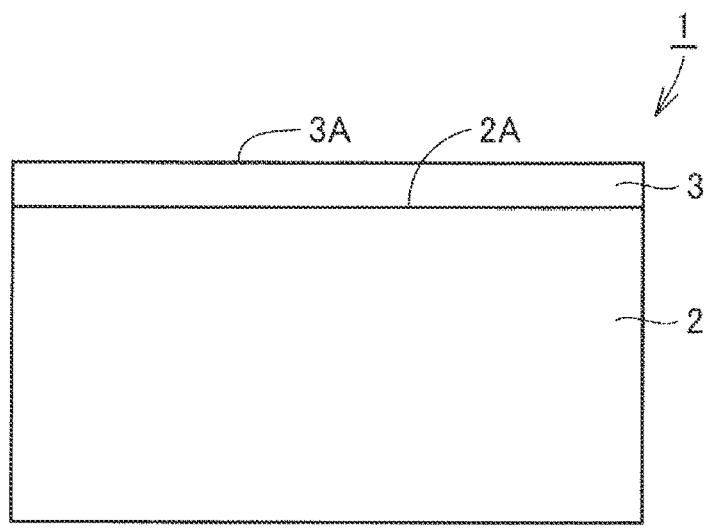
FIGS. 1A and 1B are schematic cross-sectional views showing a structure of a stacked body including a graphene film.

Problems to be Solved by the Disclosure

In the case where a stacked body in which a graphene film is formed on a substrate made of SiC is used to manufacture an electronic device in which the graphene film forms an electrically conductive portion, the mobility in the electrically conductive portion may be lower than an expected value of the mobility.

In view of the above, one object is to provide a stacked body and an electronic device including the stacked body that enable a high mobility to be stably ensured in an electronic device manufactured to include the graphene film forming an electrically conductive portion.

Effects of the Disclosure

With the stacked body of the present disclosure, a high mobility can stably be ensured in an electronic device manufactured to include the graphene film forming an electrically conductive portion.

DESCRIPTION OF EMBODIMENTS OF THE INVENTION

Initially, aspects of the present invention will be described one by one. A stacked body of the present application includes: a substrate made of silicon carbide and having a first main surface forming an angle of 20° or less with a carbon plane; and a graphene film disposed on the first main surface and having an atomic arrangement oriented in relation to an atomic arrangement of silicon carbide forming the substrate. In an exposed surface of the graphene film as seen in plan view, 10 or less regions are present per 1 mm$^2$. The exposed surface is a main surface opposite to the substrate, and the regions each include 10 or more graphene layers and have a circumcircle with a diameter of 5 µm or more and 100 µm or less.

As to the case where a stacked body in which a graphene film is formed on a substrate made of SiC is used to manufacture an electronic device in which the graphene film forms an electrically conductive portion, the inventors of the present invention studied the reasons why the mobility in the electrically conductive portion is lower than an expected value of the mobility. As a result, the inventors have found that the graphene film having an atomic arrangement oriented in relation to an atomic arrangement of SiC forming the substrate includes regions in which the graphene film thickness is partially larger, and the presence of these regions significantly influences the mobility. The regions in which the graphene film thickness is larger can be reduced to stably ensure a high mobility. Specifically, when 10 or less regions are present per 1 mm$^2$, each including 10 or more graphene layers and having a circumcircle with a diameter of 5 µm or more and 100 µm or less, a high mobility can be stably ensured.

Regarding the stacked body of the present application, in an exposed surface of the graphene film as seen in plan view, 10 or less regions are present per 1 mm$^2$ each including 10 or more graphene layers and having a circumcircle with a diameter of 5 µm or more and 100 µm or less. Therefore, an electrode can be formed on the exposed surface to manufacture the electronic device in which a high mobility is stably ensured. Thus, in the case where the stacked body of the present application is used to manufacture an electronic device in which the graphene film forms an electrically conductive portion, the stacked body enables a high mobility to be stably ensured. Preferably, three or less regions are present per 1 mm$^2$ each including 10 or more graphene layers and having a circumcircle with a diameter of 5 µm or more and 100 µm or less.

In the stacked body, the graphene film may cover 80% or more of the first main surface. Accordingly, the region where the graphene film is absent in the first main surface of the substrate is reduced. As a result, mass production of electronic devices in which the stacked body is used is facilitated.

In the stacked body, the carrier mobility in the graphene film is preferably 5000 cm$^2$/Vs or more, and more preferably 8000 cm$^2$/Vs or more. Accordingly, the switching speed of an electronic device manufactured with the stacked body can be increased.

In the stacked body, the substrate may have a disk shape. The substrate may have a diameter of 50 mm or more. Accordingly, the efficiency of manufacture of an electronic device in which the stacked body is used can be increased.

An electronic device of the present application includes the stacked body, a first electrode disposed on the exposed surface, and a second electrode disposed on the exposed surface and spaced from the first electrode.

In the electronic device of the present application, the first electrode and the second electrode are formed on the exposed surface of the stacked body of the present application. Therefore, in the electronic device of the present application, a high mobility in the electrically conductive portion can be stably ensured.

DETAILS OF EMBODIMENTS OF THE INVENTION

Next, an embodiment of the stacked body in accordance with the present invention will be described below with reference to the drawings. In the following drawings, the same or corresponding parts are denoted by the same reference numerals, and a description thereof will not be repeated.

First Embodiment

Figure 1B:
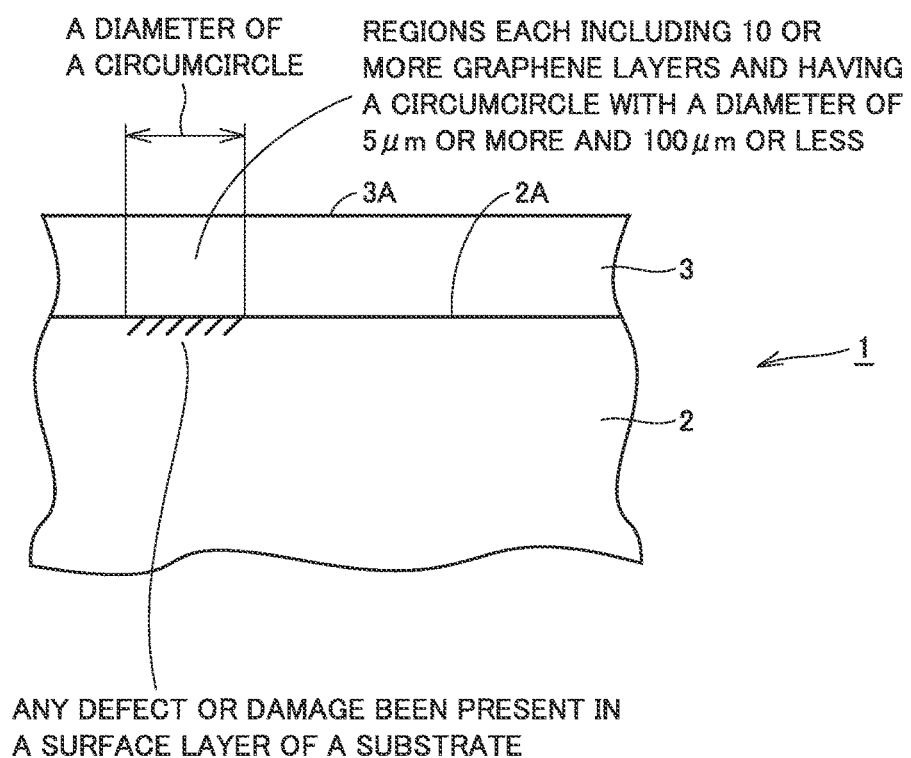

Referring to FIGS. 1A and 1B, a stacked body 1 of the present embodiment includes a substrate 2 and a graphene film 3. Substrate 2 is made of silicon carbide (SiC). The SiC forming substrate 2 is hexagonal SiC having a 6H structure, for example. Substrate 2 has a disk shape. Substrate 2 has a diameter of two inches or more (50 mm or more). Substrate 2 has a first main surface 2A. First main surface 2A is a carbon-plane-side main surface forming an angle of 20° or less with a carbon plane, namely (000-1) plane of SiC forming substrate 2. More specifically, in the present embodiment, first main surface 2A is a carbon-plane-side main surface forming an angle of 1° or less with a carbon plane of SiC forming substrate 2. Namely, first main surface 2A is substantially the carbon plane.

Graphene film 3 is disposed on first main surface 2A of substrate 2. Graphene film 3 is formed of graphene having an atomic arrangement oriented in relation to an atomic arrangement of SiC forming substrate 2. The condition in which an atomic arrangement of graphene forming graphene film 3 is oriented in relation to an atomic arrangement of SiC forming substrate 2 means that the atomic arrangement of graphene has a certain relation with the atomic arrangement of SiC forming substrate 2. Whether or not the atomic arrangement of graphene is oriented in relation to the atomic arrangement of SiC can be confirmed for example by the LEED (Low Energy Electron Diffraction) method. In an exposed surface 3A of graphene film 3, which is a main surface opposite to the substrate 2 side, as seen in plan view, 10 or less regions are present per 1 mm$^2$ each including 10 or more graphene layers and having a circumcircle with a diameter of 5 µm or more and 100 µm or less.

Regarding stacked body 1 of the present embodiment, in exposed surface 3A of graphene film 3 as seen in plan view, 10 or less regions are present per 1 mm$^2$ each including 10 or more graphene layers and having a circumcircle with a diameter of 5 µm or more and 100 µm or less. Accordingly, an electrode can be formed on exposed surface 3A to manufacture an electronic device in which a high mobility is stably ensured. Thus, stacked body 1 of the present embodiment enables a high mobility to be stably ensured in an electronic device manufactured to include graphene film 3 forming an electrically conductive portion.

Figure 2:
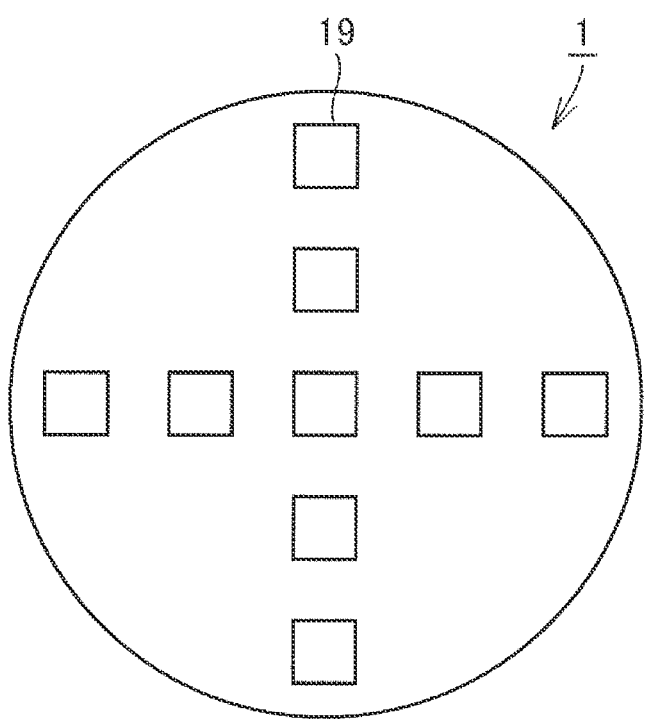
FIG. 2 is a schematic diagram for illustrating a method for evaluating a graphene film.

The number of regions each including 10 or more graphene layers and having a circumcircle with a diameter of 5 µm or more and 100 µm or less can be confirmed for example by defining measurement regions as described below. FIG. 2 is a diagram showing measurement regions in the main surface of the exposed surface 3A side of stacked body 1. For the sake of evaluating the whole of graphene film 3, nine measurement regions 19 as shown in FIG. 2 may be defined. Specifically, measurement regions 19 each in the shape of a square having a side of 50 µm are defined at nine locations. In the main surface of the exposed surface 3A side of stacked body 1 in a circular shape, measurement regions 19 are defined at regular intervals on two straight lines intersecting each other at the center of the main surface. One measurement region 19 is defined so that the intersection of its diagonal lines is located at the center of the main surface. With respect to this measurement region 19, the remaining eight measurement regions 19 are defined. Then, each measurement region 19 is evaluated by Raman spectroscopy and observed with a microscope to identify regions each including 10 or more graphene layers and having a circumcircle with a diameter of 5 µm or more and 100 µm or less, and calculate the density of the regions per 1 mm².

Graphene film 3 covers preferably 80% or more by area of first main surface 2A of substrate 2, and more preferably 95% or more by area thereof. Accordingly, the region where graphene film 3 is absent in first main surface 2A of substrate 2 is reduced. As a result, mass production of electronic devices in which stacked body 1 is used is facilitated.

The carrier mobility in graphene film 3 is preferably 5000 cm²/Vs or more, and more preferably 8000 cm²/Vs or more. Accordingly, the switching speed of an electronic device manufactured with stacked body 1 can be increased.

Figure 3:
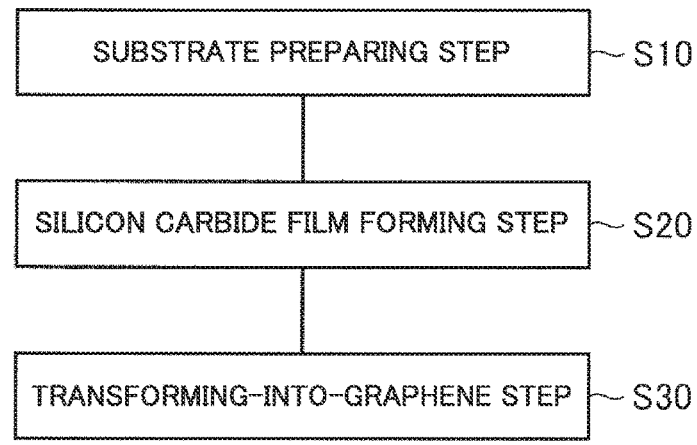
FIG. 3 is a flowchart generally showing a method for manufacturing a stacked body including a graphene film.
Figure 4:
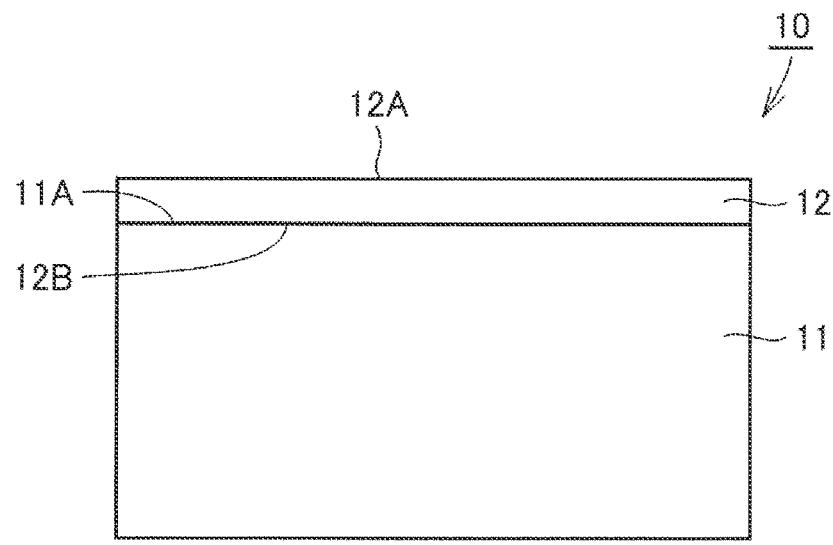
FIG. 4 is a schematic cross-sectional view for illustrating a method for manufacturing a stacked body.
Figure 5:
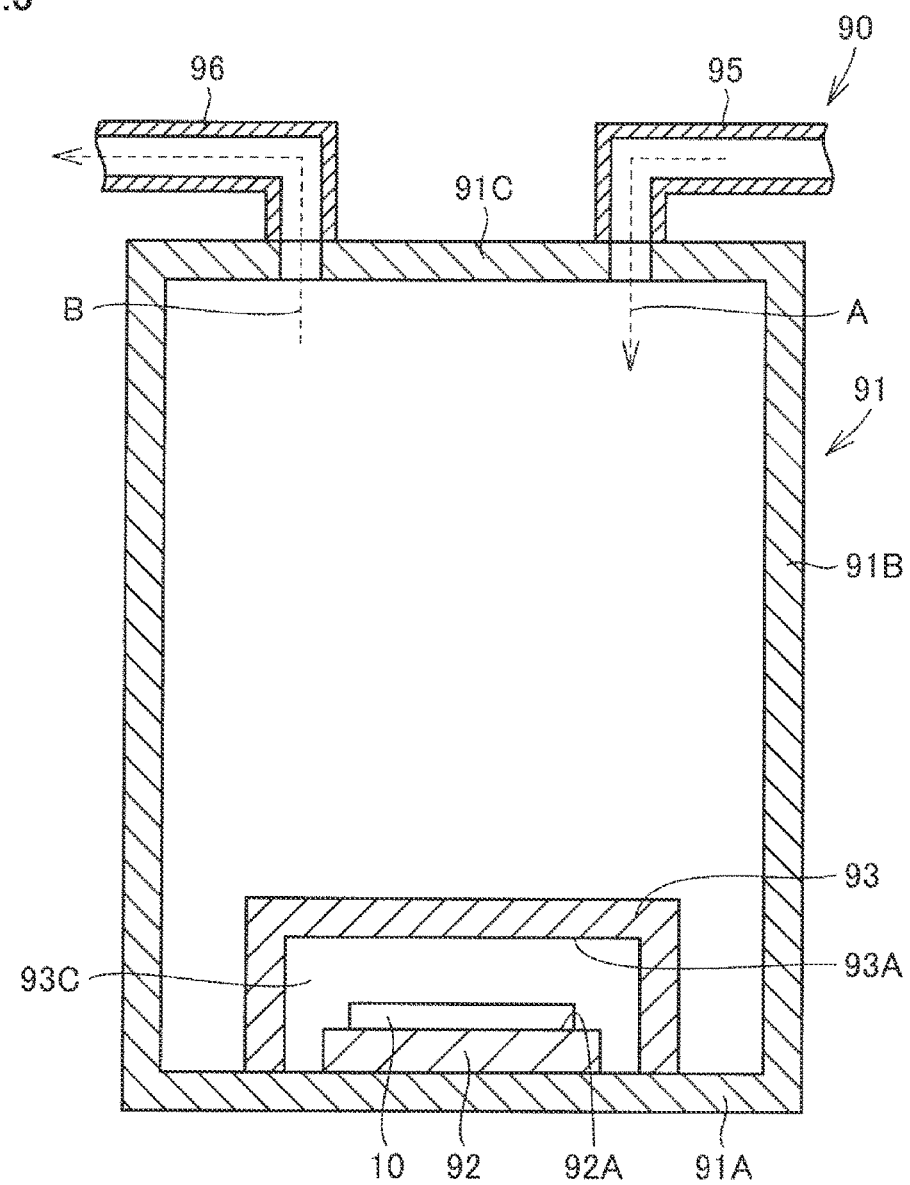
FIG. 5 is a schematic cross-sectional view showing a structure of a heating apparatus.

Referring next to FIGS. 3 to 5, a method for manufacturing stacked body 1 of the present embodiment will generally be described.

Referring to FIG. 3, in the method for manufacturing stacked body 1 of the present embodiment, initially a substrate preparing step is performed as a step (S10). Referring to FIG. 4, in this step (S10), a substrate 11 made of 6H-SiC and having a diameter of two inches (50.8 mm) for example is prepared. More specifically, an ingot made of SiC is sliced to obtain substrate 11 made of SiC. The surface of substrate 11 is polished and thereafter subjected to a process such as washing. In this way, substrate 11 having its main surface with ensured flatness and cleanliness is obtained. Substrate 11 has a first main surface 11A. First main surface 11A is the carbon-plane-side main surface forming an angle of 1° or less with a carbon plane of SiC forming substrate 11, namely with (000-1) plane. In other words, first main surface 11A is substantially a carbon plane.

Next, a silicon carbide film forming step is performed as a step (S20). Referring to FIG. 4, in this step (S20), an SiC film 12 made of silicon carbide is formed on first main surface 11A of substrate 11. Specifically, on first main surface 11A of substrate 11, SiC film 12 is formed by sputtering, for example. SiC film 12 is made of amorphous or polycrystalline SiC, for example. The thickness of SiC film 12 may for example be 0.5 nm or more and 5 nm or less. The step (S20) is thus performed to obtain a material stacked body 10 including substrate 11 and SiC film 12 formed on first main surface 11A of substrate 11.

Next, a transforming-into-graphene step is performed as a step (S30). This step (S30) can be performed with a heating apparatus shown in FIG. 5, for example. Referring to FIG. 5, heating apparatus 90 includes a main body 91, a susceptor 92, a cover member 93, a gas inlet tube 95, and a gas outlet tube 96.

Main body 91 includes a side wall 91B having a hollow cylindrical shape, a bottom wall 91A closing a first end of side wall 91B, and a top wall 91C closing a second end of side wall 91B. On bottom wall 91A within main body 91, susceptor 92 is disposed. Susceptor 92 has a substrate holding surface 92A for holding material stacked body 10.

In main body 91, cover member 93 is disposed to cover susceptor 92. Cover member 93 has a hollow cylindrical shape having a pair of ends, with one end closed and the other end opened, for example. Cover member 93 is disposed so that the other end of cover member 93 is in contact with bottom wall 91A. Susceptor 92 and material stacked body 10 on susceptor 92 are surrounded by cover member 93 and bottom wall 91A of main body 91. In a closed space 93C which is a space surrounded by cover member 93 and bottom wall 91A of main body 91, susceptor 92 and material stacked body 10 on susceptor 92 are disposed. An inner wall surface 93A of cover member 93 faces a main surface 12A of SiC film 12 in material stacked body 10, namely the main surface opposite to substrate 11 (see FIG. 4).

Gas inlet tube 95 and gas outlet tube 96 are connected to top wall 91C of main body 91. Gas inlet tube 95 and gas outlet tube 96 each have one end connecting to a through hole formed in top wall 91C. The other end of gas inlet tube 95 is connected to a gas retainer retaining an inert gas (not shown). In the present embodiment, argon is retained in the gas retainer. The other end of gas outlet tube 96 is connected to an exhaust device such as pump (not shown).

The step (S30) can be carried out using heating apparatus 90 in the following way. Initially, on a substrate holding surface 92A of susceptor 92, material stacked body 10 prepared in the step (S20) is disposed. Then, cover member 93 is disposed on bottom wall 91A so as to cover susceptor 92 and material stacked body 10. Accordingly, susceptor 92 as well as material stacked body 10 on susceptor 92 are surrounded by cover member 93 and bottom wall 91A of main body 91.

Next, a valve (not shown) disposed in gas inlet tube 95 is closed while a valve disposed in gas outlet tube 96 is opened. Then, the exhaust device connected to gas outlet tube 96 is operated to cause gas in main body 91 to be discharged from gas outlet tube 96 along arrow B. Accordingly, the inside of main body 91 is decompressed. While susceptor 92 and material stacked body 10 are surrounded by cover member 93 and bottom wall 91A of main body 91, cover member 93 is not joined to bottom wall 91A. Therefore, as the inside of main body 91 is further decompressed, the pressure difference between the inside and the outside of closed space 93C causes the internal gas to be discharged from a slight gap between cover member 93 and bottom wall 91A. As a result, the inside of closed space 93C is also decompressed.

Next, the operation of the exhaust device is stopped and the valve disposed in gas inlet tube 95 is opened. Accordingly, argon retained in the gas retainer is introduced into main body 91 through gas inlet tube 95 (arrow A). As the pressure in main body 91 increases, the pressure difference between the inside and the outside of closed space 93C causes argon to enter the closed space through a slight gap between cover member 93 and bottom wall 91A. In this way, the gas in main body 91 is replaced with argon. As the pressure of argon in main body 91 increases to the normal pressure (atmospheric pressure), extra argon is discharged from gas outlet tube 96. The pressure in main body 91 is thus kept at the normal pressure. Namely, in main body 91, an argon atmosphere at the normal pressure is maintained.

Next, material stacked body 10 is heated. Main body 91 for example is heated to thereby cause material stacked body 10 to be heated. Main body 91 may be heated by induction heating, for example. Material stacked body 10 is heated in normal-pressure argon to a temperature of 1300° C. or more and 1800° C. or less, for example. Accordingly, with reference to FIG. 4, Si atoms are desorbed from SiC forming SiC film 12, and a surface layer of SiC film 12, which is a region opposite to substrate 11 and including main surface 12A, is transformed into graphene. Meanwhile, the substrate 11 side main surface 12B of SiC film 12 is in contact with substrate 11. Therefore, this heating causes an atomic arrangement in the region including main surface 12B to be oriented in relation to the atomic arrangement of SiC forming substrate 11. As a result, the atomic arrangement of graphene generated through transformation of SiC film 12 is oriented in relation to the atomic arrangement of SiC forming substrate 11. Referring to FIGS. 1A and 1B, in this way, stacked body 1 is obtained that includes substrate 2 made of SiC, and graphene film 3 disposed on first main surface 2A of substrate 2 and having an atomic arrangement oriented in relation to the atomic arrangement of SiC forming substrate 2.

Through this procedure, stacked body 1 of the present embodiment is completed. As described above, cover member 93 is used in the present embodiment. Therefore, Si atoms desorbed from SiC film 12 remain in closed space 93C. Consequently, due to desorbing of Si from SiC film 12, the Si vapor pressure in closed space 93C increases. Thus, rapid transformation of SiC into graphene is suppressed. In this way, the rate at which SiC is transformed into graphene is lowered to thereby form graphene film 3 formed of one atomic layer or a small number of atomic layers (close to one atomic layer).

A region having a large graphene film thickness which affects reduction of the mobility is formed in a region having any surface defect of substrate 11 or damage generated during production of the substrate. In contrast, in the present embodiment, it is not the surface layer of prepared substrate 11 but SiC film 12 formed on substrate 11 that is transformed into graphene. Therefore, even in the case where any defect or damage is present in the surface layer of substrate 11, the region having a large graphene film thickness due to this can be prevented from being formed. Accordingly, it is possible to have 10 or less regions per 1 mm$^2$, each including 10 or more graphene layers and having a circumcircle with a diameter of 5 μm or more and 100 μm or less. As a result, stacked body 1 in which a high mobility can stably be ensured can be obtained.

Second Embodiment

Figure 6:
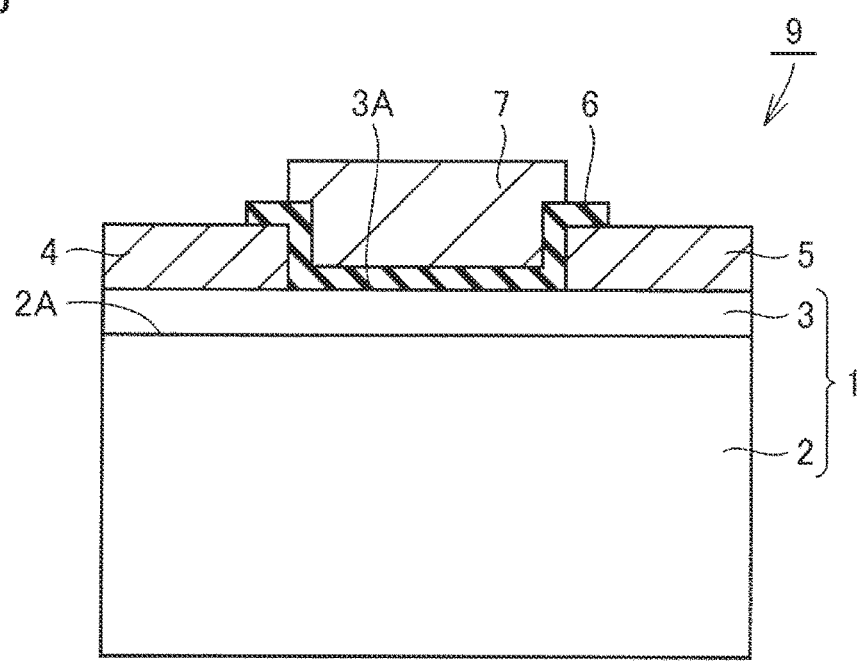
FIG. 6 is a schematic cross-sectional view showing a structure of a field effect transistor (FET) including a graphene film.

Next, a description will be given of an FET (Field Effect Transistor) which is an example of the electronic device produced with stacked body 1 of the first embodiment. Referring to FIG. 6, an FET 9 of the present embodiment is produced with stacked body 1 of the first embodiment, and includes stacked body 1 including substrate 2 and graphene film 3 which are stacked like the first embodiment. FET 9 further includes a source electrode 4 as a first electrode, a drain electrode 5 as a second electrode, a gate electrode 7 as a third electrode, and a gate insulating film 6.

Source electrode 4 is formed in contact with exposed surface 3A. Source electrode 4 is formed of a conductor which can make ohmic contact with graphene film 3, such as Ni (nickel)/Au (gold), for example. Drain electrode 5 is formed in contact with exposed surface 3A. Drain electrode 5 is formed to be spaced from source electrode 4. Drain electrode 5 is formed of a conductor which can make ohmic contact with graphene film 3, such as Ni/Au, for example.

Gate insulating film 6 is formed to cover exposed surface 3A of graphene film 3 located between source electrode 4 and drain electrode 5. Gate insulating film 6 not only covers exposed surface 3A located between source electrode 4 and drain electrode 5 but also extends to regions which partially cover the upper surface (the main surface opposite to the surface contacting graphene film 3) of source electrode 4 and drain electrode 5. Gate insulating film 6 is formed of an insulator such as silicon nitride (SiN) or aluminum oxide ($Al_2O_3$), for example.

Gate electrode 7 is disposed to contact the upper surface of gate insulating film 6. Gate electrode 7 is disposed in a region corresponding to exposed surface 3A located between source electrode 4 and drain electrode 5. Gate electrode 7 is formed of a conductor such as Ni/Au, for example.

When FET 9 is in a state that a voltage applied to gate electrode 7 is less than a threshold voltage, namely when FET 9 is in the OFF state, electrons to serve as carriers are not sufficiently present in graphene film 3 (channel region) located between source electrode 4 and drain electrode 5, and the non-conducting state is maintained even when a voltage is applied between source electrode 4 and drain electrode 5. In contrast, when a voltage of the threshold value or more is applied to gate electrode 7 to make FET 9 in the ON state, electrons to serve as carriers are generated in the channel region. As a result, the channel region in which electrons to serve as carriers are generated causes a state where source electrode 4 and drain electrode 5 are electrically connected to each other. When a voltage is applied between source electrode 4 and drain electrode 5 in such a state, current flows between source electrode 4 and drain electrode 5.

As to FET 9 of the present embodiment, source electrode 4 and drain electrode 5 are formed on exposed surface 3A of stacked body 1 described above in connection with the first embodiment. Therefore, a high mobility is stably ensured in graphene film 3 corresponding to a channel region as an electrically conductive portion. As a result, FET 9 is an electronic device having the increased switching speed. As a characteristic of FET 9, $R_c$ (contact resistance) of FET 9 is preferably less than 1 Ωcm, and more preferably less than 0.5 Ωcm. Moreover, $R_s$ (sheet resistance) of FET 9 is preferably less than 1000 Ωsq, and more preferably less than 500 Ωsq. Further, $g_m$ (mutual conductance) of FET 9 is preferably more than 100 mS, and more preferably more than 1000 mS. fT (cutoff frequency) of FET 9 is preferably more than 100 GHz, and more preferably more than 1 THz.

Figure 7:
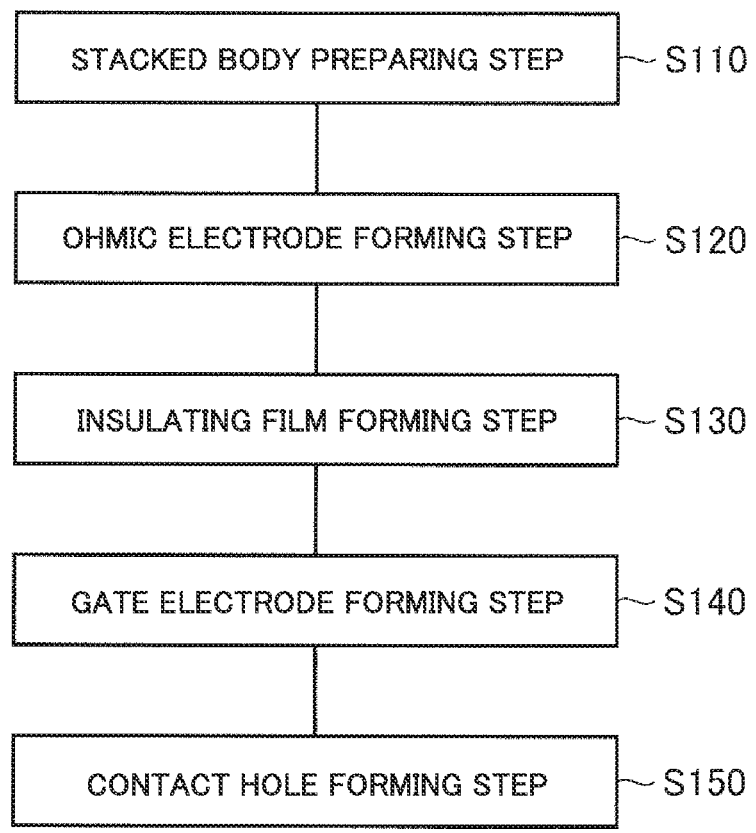
FIG. 7 is a flowchart generally showing a method for manufacturing a field effect transistor including a graphene film.

Referring next to FIGS. 1A and 1B and FIGS. 6 to 10, a method for manufacturing FET 9 of the present embodiment will be described. Referring to FIG. 7, in the method for manufacturing FET 9 of the present embodiment, a stacked body preparing step is performed first as a step (S110). In this step (S110), stacked body 1 of the first embodiment is prepared (see FIGS. 1A and 1B). Stacked body 1 can be manufactured by the manufacturing method described above in connection with the first embodiment.

Figure 8:
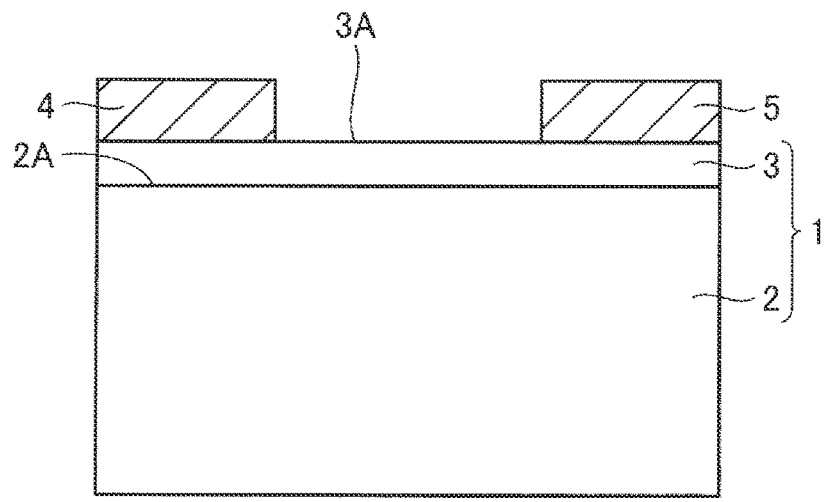
FIG. 8 is a schematic cross-sectional view for illustrating the method for manufacturing a field effect transistor including a graphene film.

Next, referring to FIG. 7, an ohmic electrode forming step is performed as a step (S120). Referring to FIGS. 1A and 1B and 8, in this step (S120), source electrode 4 and drain electrode 5 are formed in contact with exposed surface 3A of stacked body 1. Source electrode 4 and drain electrode 5 can be formed in the following way, for example. On exposed surface 3A of graphene film 3, a mask layer made of a resist is formed having openings corresponding to respective regions where source electrode 4 and drain electrode 5 are to be formed. Then, an electrically conductive film made of a conductor (Ni/Au, for example) which is to form source electrode 4 and drain electrode 5 is formed, and a lift-off process is performed to thereby form source electrode 4 and drain electrode 5.

Figure 9:
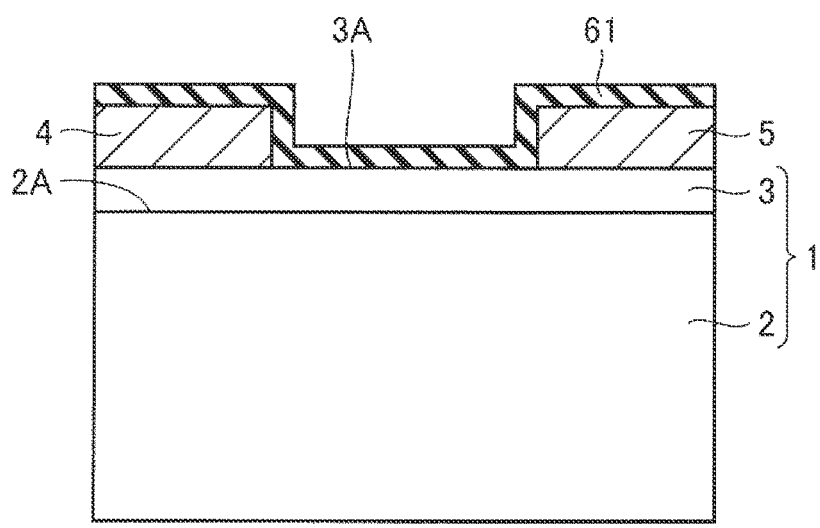
FIG. 9 is a schematic cross-sectional view for illustrating the method for manufacturing a field effect transistor including a graphene film.

Referring next to FIG. 7, an insulating film forming step is performed as a step (S130). Referring to FIGS. 8 and 9, in this step (S130), an insulating film 61 is formed to cover exposed surface 3A of graphene film 3 located between source electrode 4 and drain electrode 5 and to cover the main surface of source electrode 4 which is opposite to stacked body 1 and a main surface of drain electrode 5 which is opposite to stacked body 1. Insulating film 61 can be formed by CVD, for example. As a material forming insulating film 61, silicon nitride for example may be used.

Figure 10:
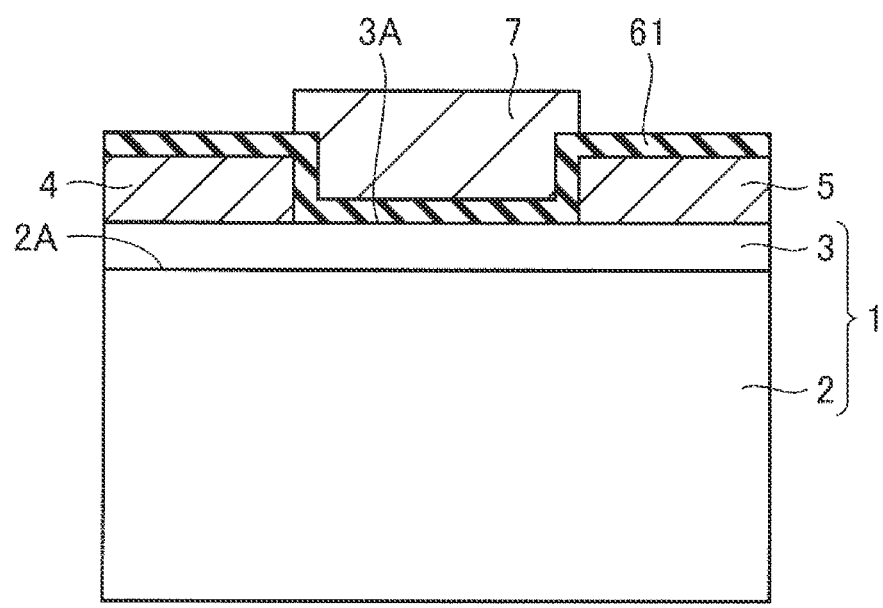
FIG. 10 is a schematic cross-sectional view for illustrating the method for manufacturing a field effect transistor including a graphene film.

Referring next to FIG. 7, a gate electrode forming step is performed as a step (S140). Referring to FIGS. 9 and 10, in this step (S140), gate electrode 7 is formed to contact the top surface of insulating film 61 which covers exposed surface 3A located between source electrode 4 and drain electrode 5. Gate electrode 7 can be formed in the following way, for example. A mask layer made of a resist is formed having an opening corresponding to a region where gate electrode 7 is to be formed. Then, an electrically conductive film made of a conductor (Ni/Au for example) which is to form gate electrode 7 is formed, and a lift-off process is performed to thereby form gate electrode 7.

Next, referring to FIG. 7, a contact hole forming step is performed as a step (S150). Referring to FIGS. 10 and 6, in this step (S150), insulating film 61 located on source electrode 4 and drain electrode 5 is removed to form a contact hole for enabling contact between an interconnection and source electrode 4 and drain electrode 5. Specifically, for example, a mask is formed having openings in respective regions above source electrode 4 and drain electrode 5, and insulating film 61 exposed from the openings is etched away. In this way, contact holes are formed and remaining insulating film 61 forms gate insulating film 6. Gate insulating film 6 not only covers exposed surface 3A located between source electrode 4 and drain electrode 5 but also extends to regions which partially cover the upper surface (the main surface opposite to the surface contacting graphene film 3) of source electrode 4 and drain electrode 5.

Through these steps, FET 9 of the present embodiment is completed. Interconnections for example are thereafter formed, and each device is separated by dicing.

INDUSTRIAL APPLICABILITY

The stacked body of the present application is particularly advantageously applicable to a stacked body and an electronic device including a graphene film required to exhibit a high mobility, for example.

While embodiments of the present invention have been described, it should be construed that the embodiments disclosed herein are given by way of illustration in all respects, not by way of limitation. It is intended that the scope of the present invention is defined by claims, and encompasses all modifications equivalent in meaning and scope to the claims.

What is claimed is:

1. A stacked body comprising:
    a substrate made of silicon carbide and having a first main surface forming an angle of 20° or less with a carbon plane; and
    a graphene film disposed on the first main surface and having an atomic arrangement oriented to an atomic arrangement of silicon carbide forming the substrate,
    the atomic arrangement oriented to the atomic arrangement of the silicon carbide is confirmed by a low energy electron diffraction method,
    in an exposed surface of the graphene film as seen in plan view, 10 or less regions are present per 1 mm$^2$,
        the exposed surface being a main surface opposite to the substrate, and
        the regions each including 10 or more graphene layers and having a circumcircle with a diameter of 5 µm or more and 100 µm or less.
2. The stacked body according to claim 1, wherein the graphene film covers 80% or more of the first main surface.
3. The stacked body according to claim 1, wherein carrier mobility in the graphene film is 5000 cm$^2$/Vs or more.
4. The stacked body according to claim 1, wherein the substrate has a disk shape, and the substrate has a diameter of 50 mm or more.
5. An electronic device comprising:
    the stacked body as recited in claim 1;
    a first electrode disposed on the exposed surface; and
    a second electrode disposed on the exposed surface and spaced from the first electrode.

* * * * *